(12) United States Patent
Satullo et al.

(10) Patent No.: US 6,977,337 B1
(45) Date of Patent: Dec. 20, 2005

(54) ELECTRONIC ASSEMBLY PACKAGING

(75) Inventors: Anthony Nicolo Satullo, Beverly Hills, MI (US); Robert E. Belke, West Bloomfield, MI (US); Hong Zhou, Ann Arbor, MI (US); Diane M. Jett, Warren, MI (US); Bertrand R. Mohr, Ann Arbor, MI (US); John Trublowski, Troy, MI (US); Michael S. Schulke, Royal Oak, MI (US); Adam W. Schubring, Canton, MI (US)

(73) Assignee: Visteon Global Technologies, Inc., Van Buren Township, MI (US)

( * ) Notice: Subject to any disclaimer, the term of this patent is extended or adjusted under 35 U.S.C. 154(b) by 0 days.

(21) Appl. No.: 10/869,729

(22) Filed: Jun. 16, 2004

(51) Int. Cl.[7] .............................. H01L 23/28

(52) U.S. Cl. ..................... 174/52.2; 174/52.1; 361/752

(58) Field of Search ............... 174/52.1, 52.3, 174/52.4, 35 GC, 35 R; 361/748, 752, 753, 361/799, 800, 816, 818; 237/659, 660

(56) References Cited

U.S. PATENT DOCUMENTS

| | | | |
|---|---|---|---|
| 3,075,487 A | 1/1963 | Appleton | |
| 4,196,467 A | 4/1980 | Jakob et al. | |
| 5,142,434 A | 8/1992 | Boy et al. | |
| 5,535,098 A | 7/1996 | Jakob et al. | |
| 5,712,765 A | 1/1998 | Lehrmann et al. | |
| 5,796,033 A | 8/1998 | Stoyko | 174/35 C |
| 5,838,551 A | 11/1998 | Chan | 361/818 |
| 5,981,871 A | 11/1999 | Trumble et al. | 174/35 GC |
| 6,222,122 B1 | 4/2001 | Davidson | 174/52.4 |
| 6,326,761 B1 | 12/2001 | Tareilus | |
| 6,374,912 B1 | 4/2002 | LaGrotta et al. | |
| 6,676,137 B2 | 1/2004 | Dean | 277/628 |

*Primary Examiner*—Hung V. Ngo
(74) *Attorney, Agent, or Firm*—Brinks Hofer Gilson & Lione

(57) ABSTRACT

The present invention provides an assembly for protecting automotive electronics. The assembly includes a circuit board, a cover, and a metal housing. The metal housing is disposed over and around the circuit board. The cover and metal housing are crimped together to create a seal that protects the circuit board inside the metal housing and attaches the cover to the metal housing.

21 Claims, 4 Drawing Sheets

US 6,977,337 B1

ELECTRONIC ASSEMBLY PACKAGING

BACKGROUND

1. Field of the Invention

The present invention generally relates to an assembly for protecting electronic components.

2. Description of Related Art

Powertrain control modules are currently packaged in diverse mechanical configurations. Such mechanical configurations often involve expensive custom die cast and stamp metal covers bonded to other custom polymeric or metal parts to protect the electronic assembly. Powertrain control modules must be designed to operate in harsh, under hood environmental conditions. Yet the high volume required to fulfill an automotive application also requires a cost effective design. The current cost of a typical aluminum die cast housing may represent a significant cost of the overall module. In addition, stamped metal and die cast covers are susceptible to gaps between the top and bottom covers increasing susceptibility to environmental conditions and electromagnetic interference. Further, plastic configurations may offer no electromagnetic interference protection at all.

In view of the above, it is apparent that there exists a need for an improved assembly for protecting electronic components.

SUMMARY

In satisfying the above need, as well as, overcoming the enumerated drawbacks and other limitations of the related art, the present invention provides an assembly for protecting automotive electronics. The assembly includes a circuit board, a cover, and a metal housing. The metal housing is disposed over and around the circuit board. The cover and metal housing are crimped together to create a seal that protects the circuit board inside the metal housing and attaches the cover to the metal housing.

In another aspect of the present invention, the metal housing may be a deep drawn metal housing, or alternatively a rolled metal sheet joined at two ends to create a seam that is welded or soldered. In addition, the metal housing may be coated with an anti-corrosive material. To provide thermal dissipation and support the circuit board, a surface in the form of a groove or trough extending inward from the metal housing towards the circuit board.

In another aspect of the present invention, the cover may include an electrical connector providing electrical communication with the circuit board from outside the assembly. Further, the electrical connector may be molded into the cover thereby providing improved sealing between the cover and the connector.

In another aspect of the present invention, the crimped region attaching the cover to the metal housing extends along the entire perimeter or along substantially the entire perimeter between the metal housing and the cover. The enlarged region includes a portion of the metal housing and a portion of the cover crimped together forming mating surfaces on the metal housing and the flange, thereby attaching the metal housing to the cover.

Further objects, features and advantages of this invention will become readily apparent to persons skilled in the art after a review of the following description, with reference to the drawings and claims that are appended to and form a part of this specification.

DETAILED DESCRIPTION

Figure 1:
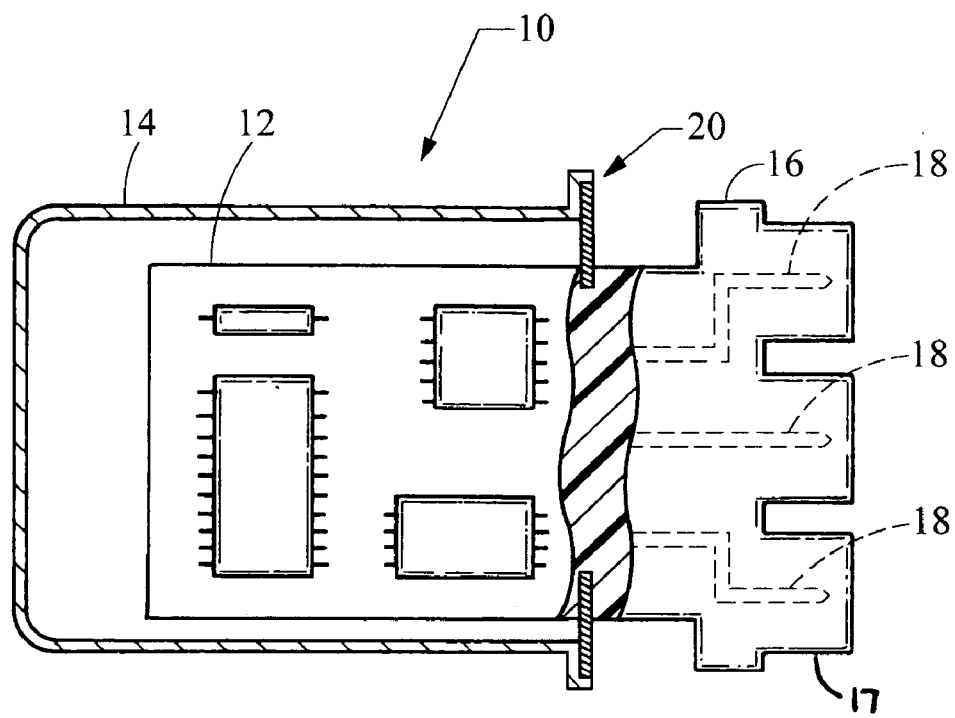
FIG. 1 is a top view of an assembly for protecting electronic components in accordance with the principles of the present invention.

Referring now to FIG. 1, an assembly embodying the principles of the present invention is illustrated therein and designated at 10. The assembly 10 includes a circuit board 12, a metal housing 14, and a cover 16.

Figure 2:
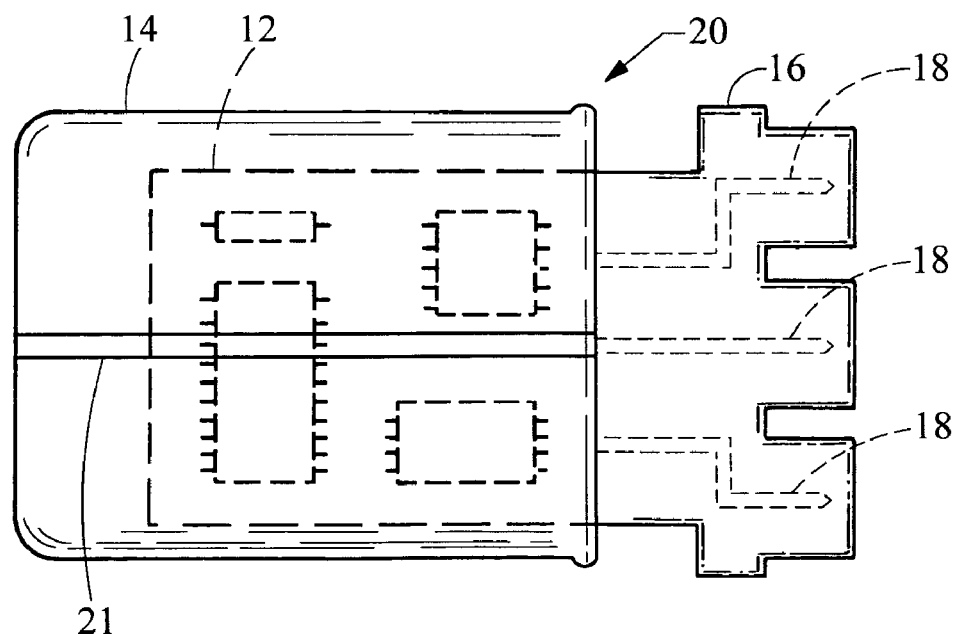
FIG. 2 is an assembly utilizing a rolled metal sheet to form a housing for protecting electronic components in accordance with the principles of the present invention.

The cover 14 is disposed about the circuit board 12 to protect electronic components from the environment surrounding the assembly 10. The cover 16 may include an electrical connector 17 with electrical contacts 18 that provide an electrical connection through the cover 16 to the printed circuit board 12. The electrical connector 17 may be molded as part of the cover 16 to provide a robust seal therebetween. The metal housing 14 is attached to and seals with the cover 16 in a crimped region 20. The metal housing 14 may be a deep drawn metal housing, as shown in FIG. 1, or alternatively, the metal housing 14 may be a seamed metal housing made of a rolled metal sheet, as shown in FIG. 2. If the metal housing 14 is made of the rolled metal sheet, the seam joining the two ends of the sheet may be welded or soldered. In addition, an anti-corrosive coating may be applied to the inner or outer surfaces of the deep drawn or rolled metal housing.

Figure 3:
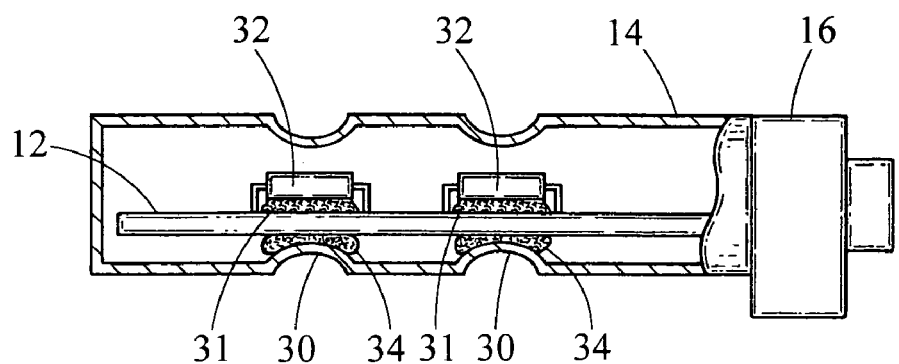
FIG. 3 is a sectional side view of the assembly with the metal housing having portions to support the circuit board and aid in thermal dissipation.

Now referring to FIG. 3, a sectional side view of the assembly 10 is provided. The circuit board 12 is attached to and extends from the cover 16. The metal housing 14 is disposed about a portion of the circuit board 12 extending from the cover 16. Electrical components 32 are mounted on a first surface of the circuit board 12 and a layer of thermal adhesive is disposed therebetween to secure the electrical components 32 and aid in dissipating heat generated by the electrical components 32. A surface 30 of the metal housing 14 extends inwardly toward the circuit board 12. The surface 30 provides additional surface area in close proximity to the component to aid in heat dissipation. In addition, the surface 30 may be configured to support the circuit board 12. In the example shown, a thermal adhesive 34 is disposed between the surface 30 and the circuit board 12 allowing the surface 30 to mechanically support the circuit board 12 and also providing a more efficient thermal path between the electrical components 32 and the metal housing 14. Although, a thermal adhesive 34 is shown disposed between the surface 30 of the metal housing 14, the metal housing 14 may directly support the circuit board 12 or alternatively, other elastic materials may be disposed therebetween.

Figure 4A:
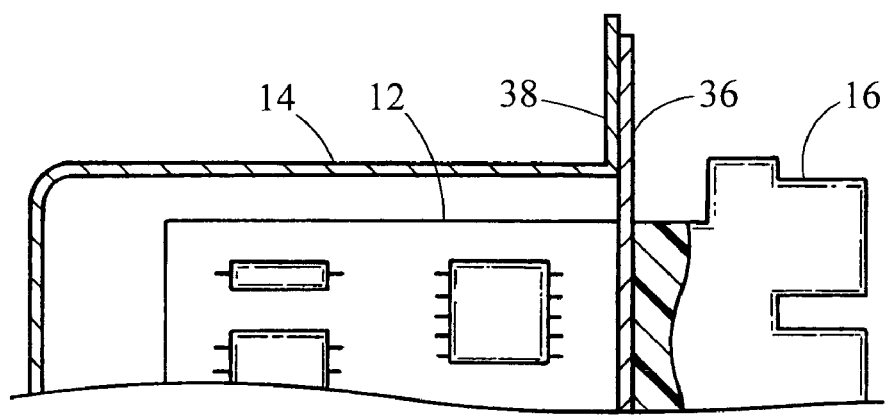
FIGS. 4A and 4B are a sectional side view of the crimped region illustrating a rolled crimp in accordance with the principles of the present invention.
Figure 4B:
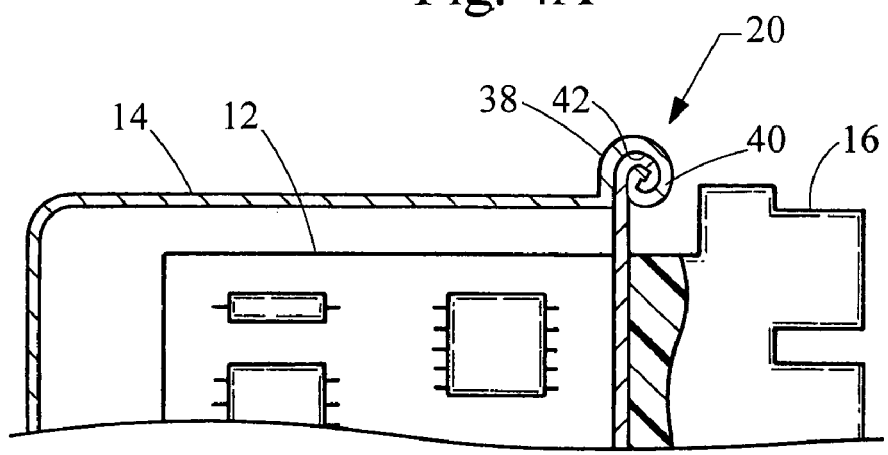

Now referring to FIG. 4A, the crimped region 20 attaching the cover 16 and the metal housing 14 is provided in more detail. Extending from the metal housing 14 a flap 38 extends from the metal housing 14. The cover 16 has a flange 36 extending from the cover 16 substantially parallel to the flap 38. A crimped region 20 is formed by rolling the flap 38 together with the flange 36 such that a surface 40 of the flap 38 mates with a surface 42 of the flange 36, thereby creating a seal and attaching the metal housing 14 to the cover 16 as shown in FIG. 4B. Further, the flange 36 may be made of a conductive metal and crimped around the entire or substantially the entire perimeter of the metal housing 14, thereby creating a continuous electromagnetic shield including the metal housing 14 and the cover 16, around the circuit board 12. For future repair of the circuit board 12, the flap 38 and flange 36 may be unrolled or straightened allowing access to the circuit board 12, then resealed with the old cover or a new cover by rerolling or recrimping the metal housing 14 to the cover 16.

Figure 5A:
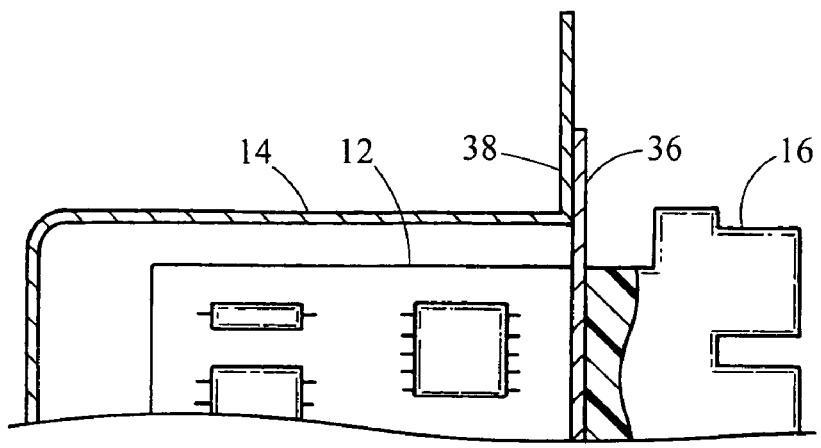
FIGS. 5A–D are a sectional side view of the crimped region where the cover is folded over the flange.
Figure 5B:
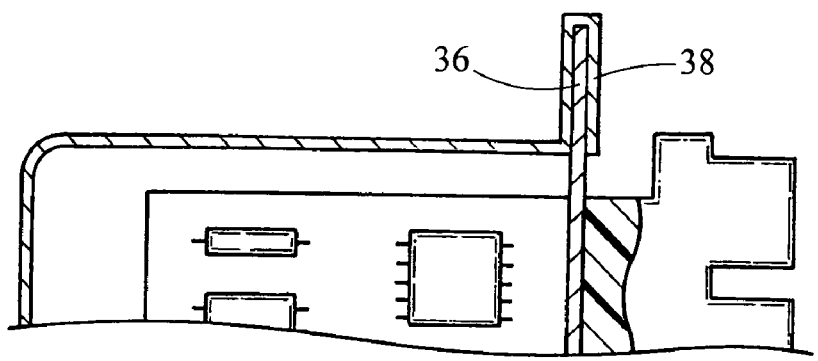
Figure 5C:
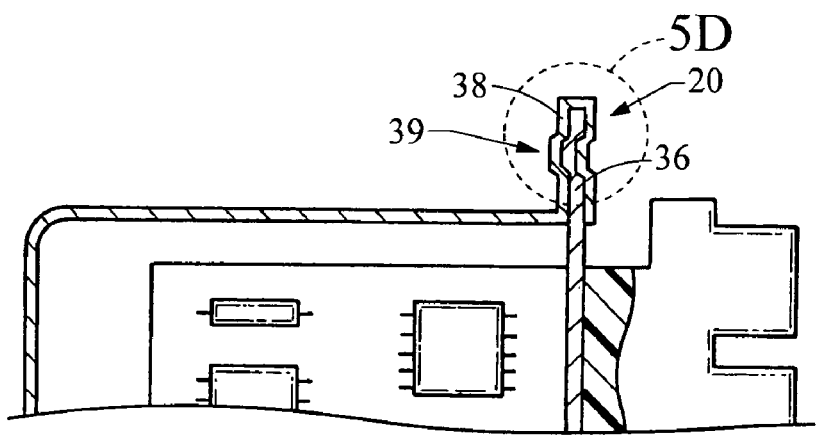
Figure 5D:
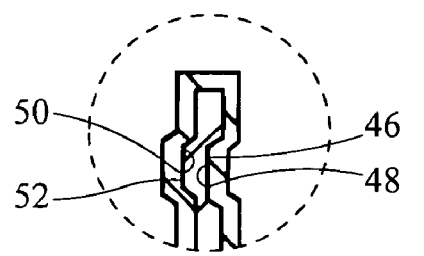

Now referring to FIG. 5A, another embodiment of the crimped region 20 is provided in accordance with the present invention. The flap 38 may extend beyond the length of the flange 36 as shown in FIG. 5A. The flap 38 may then be folded over the flange 36 as depicted in FIG. 5B. As such, the sealed surface area between the flap 38 and the flange 36 increases over the previous rolled embodiment. A crimp 39 is introduced to both the flap 38 and the flange 36 such that a first surface 46 of the flap 38 mates with a first side 48 of the flange 36 and a second surface 52 of the flap 38 mates with a second side 50 of the flange 36, thereby creating a seal and attaching the metal housing 14 to the cover 16, as shown in FIGS. 5C and 5D.

Figure 6A:
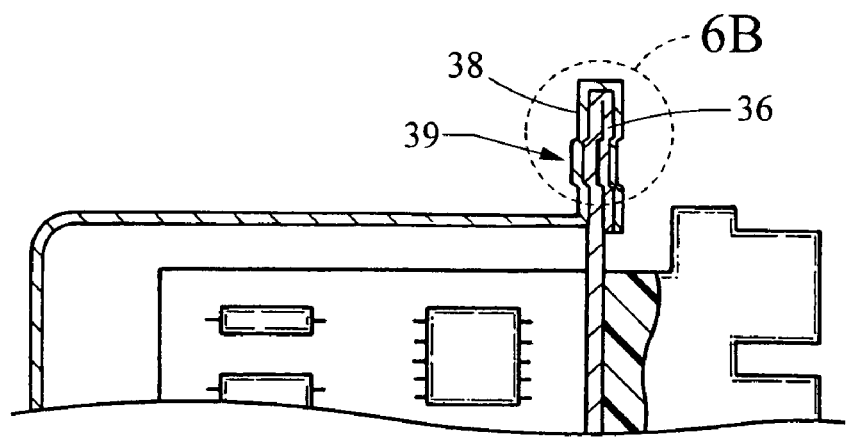
FIGS. 6A and 6B are a sectional side view of the crimped region where both the cover and flange are folded over and crimped.
Figure 6B:
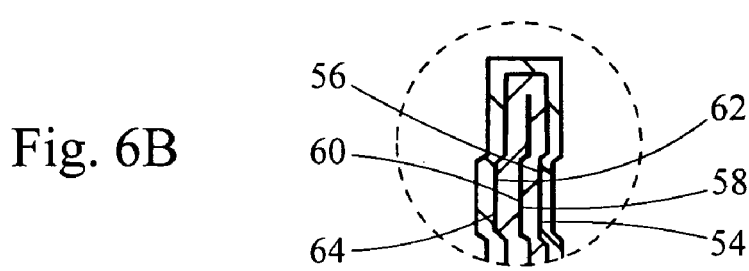

Now referring to FIG. 6A, another embodiment of the crimped region 20 is provided. In this embodiment both the flap 38 and the flange 36 are folded over together and the crimp 39 is created in all four layers (two layers of the flange and two layers of the flap). The crimp 39 creates a controlled bend in the flap 38 and flange 36 such that, a first surface 54 of the flap 38 mates with a first surface 56 of the flange, a second surface 58 of the flange 36 mates with a third surface 60 of the flange 36, a fourth surface 62 of the flange 36 mates with a second surface 64 of the flap 38, thereby creating a seal and attaching the metal housing 14 to the connector cover 16, as depicted in FIG. 6B.

Figure 7:
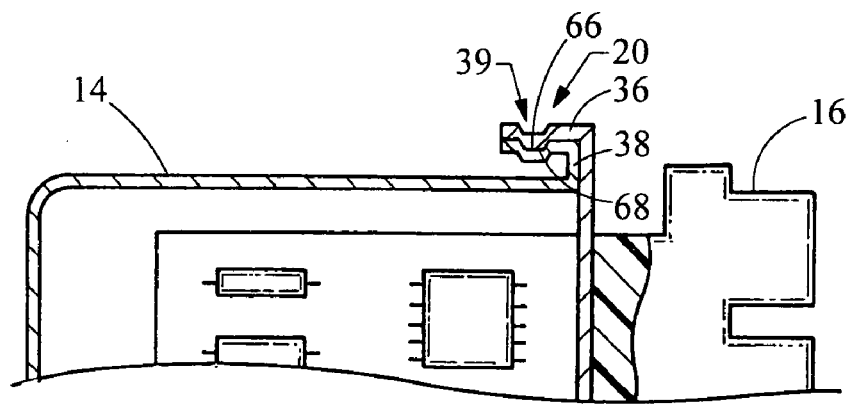
FIG. 7 is a sectional side view of the crimped region where the flange is folded over the cover and the flange and cover are crimped.

Now referring to FIG. 7, another embodiment of the crimped region 20 is provided. In the embodiment shown in FIG. 7, both the flange 36 and the flap 38 are folded at a 90° angle. The flap 38 and flange 36 may be folded to extend along the metal housing 14, although it is contemplated that the flap 38 and flange 36 may also be folded to extend along the cover 16. A crimp 39 is imparted to the flange 36 and flap 38. The crimp 39 forms a mating surface 66 on the flap 38 and a mating surface 68 on the flange 36, thereby forming a seal and attaching the metal housing 14 to the cover 16.

As a person skilled in the art will readily appreciate, the above description is meant as an illustration of implementation of the principles this invention. This description is not intended to limit the scope or application of this invention in that the invention is susceptible to modification, variation and change, without departing from spirit of this invention, as defined in the following claims.

We claim:

1. An assembly for protecting automotive electronics, the assembly comprising:
 a circuit board;
 a cover including a flange extending from the cover;
 a metal housing disposed over the circuit board, wherein the metal housing and the flange includes a crimped region the crimped region including a bent portion wherein the metal housing is in mated engagement with the flange.

2. The assembly according to claim 1, wherein the crimped region forms a seal between the metal housing and the cover.

3. The assembly according to claim 1, wherein the metal housing includes a seamless recess formed in the metal housing and configured to receive the circuit board.

4. The assembly according to claim 1, wherein the metal housing is a metal sheet including a seam along the length of the housing where two ends of the metal sheet are joined.

5. The assembly according to claim 4, wherein the metal housing is welded along the length of the seam.

6. The assembly according to claim 4, wherein the metal housing is soldered along the length of the seam.

7. The assembly according to claim 4, wherein the metal housing is crimped together along the seam.

8. The assembly according to claim 4, wherein the metal housing is an adhesive applied along the seam.

9. The assembly according to claim 8, wherein the adhesive is an electrically conductive adhesive.

10. The assembly according to claim 1, wherein the metal housing is coated with an anti-corrosive material.

11. The assembly according to claim 1, wherein the metal housing includes at least one surface extending toward the circuit board to provide improved thermal dissipation.

12. The assembly according to claim 11, wherein the at least one surface provides mechanical support to the circuit board.

13. The assembly according to claim 1, wherein the crimped region extends along the entire perimeter between the metal housing and the cover.

14. The assembly according to claim 1, wherein the crimped region extends along substantially the entire perimeter between the metal housing and the cover.

15. The assembly according to claim 1, wherein a portion of the metal housing and a portion of the cover are crimped together forming mating surfaces on the metal housing and the cover, thereby attaching the metal housing to the cover.

16. The assembly according to claim 15, wherein the metal housing is folded over the cover and crimped such that a first surface of the metal housing mates with a first side of the cover and a second surface of the metal housing mates with a second side of the cover.

17. The assembly according to claim 15, wherein both the metal housing and cover are folded over and crimped such that a first surface of the metal housing mates with a first surface of the cover, a second surface of the cover mates with a third surface of the cover, and a fourth surface of the cover mates with a second surface of the metal housing.

18. The assembly according to claim 1, wherein the metal housing and the cover are rolled together to form the crimped region thereby attaching the metal housing to the cover.

19. The assembly according to claim 1, wherein the cover is mechanically coupled to the circuit board.

20. The assembly according to claim 1, wherein the cover includes an electrical connector providing electrical communication with the circuit board from outside the assembly.

21. The assembly according to claim 1, wherein the electrical connector is molded together with the cover.

* * * * *